United States Patent
Jeon et al.

(10) Patent No.: US 7,053,448 B2
(45) Date of Patent: May 30, 2006

(54) SONOS TYPE MEMORY DEVICE

(75) Inventors: Sang-hun Jeon, Yongin-si (KR); Chung-woo Kim, Seongnam-si (KR); Dong-joon Ma, Anyang-si (KR); Sung-kyu Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/070,090

(22) Filed: Mar. 3, 2005

(65) Prior Publication Data

US 2005/0205920 A1  Sep. 22, 2005

(30) Foreign Application Priority Data

Mar. 17, 2004  (KR)  ...................... 10-2004-0017998

(51) Int. Cl.
*H01L 29/792* (2006.01)

(52) U.S. Cl. .................. 257/324; 257/410; 257/411

(58) Field of Classification Search ...................... None
See application file for complete search history.

(56) References Cited

U.S. PATENT DOCUMENTS

2004/0069990 A1 *  4/2004  Mahajani et al. ............. 257/66

FOREIGN PATENT DOCUMENTS

KR  10-2005-0070806  7/2005

OTHER PUBLICATIONS

Robertson, John, "Band offsets of wide-band-gap oxides and implications for future electronic devices", May/Jun. 2000, J. Vac. Sci. Technol., p. 1785-1791.*

* cited by examiner

*Primary Examiner*—Tu-Tu Ho
(74) *Attorney, Agent, or Firm*—Lee & Morse, P.C.

(57) ABSTRACT

A SONOS type memory includes a semiconductor substrate, first and second impurity regions in the semiconductor substrate doped with impurity ions of a predetermined conductivity, separated a predetermined distance from each other, a channel region between the first and second impurity regions, and a data storage type stack on the semiconductor substrate between the first and second impurity regions. The data storage type stack includes a tunneling oxide layer, a memory node layer for storing data, a blocking oxide layer, and an electrode layer, which are sequentially formed. A dielectric constant of the memory node layer is higher than dielectric constants of the tunneling and the blocking oxide layers, and a band offset of the memory node layer is lower than band offsets of the tunneling and the blocking oxide layers. The tunneling oxide layer and the blocking oxide layer are high dielectric insulating layers.

5 Claims, 3 Drawing Sheets

SONOS TYPE MEMORY DEVICE

BACKGROUND OF THE INVENTION

1. Field of the Invention

The present invention relates to a semiconductor memory device. More particularly, the present invention relates to a silicon oxide nitride oxide semiconductor (SONOS) type memory device including a high permittivity dielectric layer.

2. Description of the Related Art

A data storage capacity of a semiconductor memory device is proportional to the number of memory cells per unit area, i.e., an integration density. The semiconductor memory device includes many memory cells connected to one another.

In general, one memory cell of the semiconductor memory device, e.g., a dynamic random access memory (DRAM), includes a single transistor and a single capacitor. Accordingly, to increase the integration density of the semiconductor memory, the size of the transistor and/or the capacitor should be reduced.

As semiconductor technology and related electronic technologies are improved, a semiconductor memory device having a high integration density is required. However, reducing the size of the transistor and/or capacitor alone cannot satisfy this requirement.

The integration density of a semiconductor memory device is closely related to a design rule applied to the manufacturing process of the semiconductor memory. Accordingly, in order to increase the integration of the semiconductor memory device, a strict design rule must be used during manufacturing. This results in the photolithographic and etching processes having low process margins. In other words, more precise photolithographic and etching processes should be applied to the manufacturing of a highly integrated semiconductor memory device.

When the margins of the photolithographic and etching processes in the manufacturing process of the semiconductor memory device are decreased, yield also decreases. Therefore, a method of increasing the integration density of a semiconductor memory device while preventing the corresponding decrease in yield is needed.

Thus, a semiconductor memory device having a structure different from that of conventional semiconductor memory devices has been created in which the conventional capacitor has been replaced by other structures on the transistor. In these other structures, data are stored relying on different effects than that of a conventional capacitor. For example, these structures may rely on a giant magneto-resistance (GMR) effect or a tunneling magneto-resistance (TMR) effect. A silicon oxide nitride oxide semiconductor (SONOS) memory is such a semiconductor memory device. FIG. 1 illustrates a cross-sectional view of a conventional SONOS memory.

Referring to FIG. 1, the conventional SONOS memory includes a p-type semiconductor substrate 10, which will be referred to as a semiconductor substrate. A source region 12 and a drain region 14 doped with an n-type impurity are formed in the semiconductor substrate 10. A channel region 16 exists between the source and drain regions 12 and 14. A gate stack 30 is formed on the channel region 16 of the semiconductor substrate 10. The gate stack 30 includes a tunneling oxide layer 18, a silicon nitride ($Si_3N_4$) layer 20, a blocking oxide layer 22, and a gate electrode 24, which are sequentially stacked. The tunneling oxide layer 18 contacts the source and drain regions 12 and 14. The silicon nitride layer 20 includes a trap site having a predetermined density. Accordingly, when a predetermined voltage is applied to the gate electrode 24, electrons that have passed through the tunneling oxide layer 18 are trapped in the trap site of the silicon nitride layer 20. The blocking oxide layer 22 prevents the electrons from moving to the gate electrode 24 when the electrons are trapped in the trap site. The tunneling oxide layer 18 and the blocking oxide layer 22 may be formed of silicon oxide.

The threshold voltage of the conventional SONOS memory device when electrons are trapped in the trap site of the silicon nitride layer is different from the threshold voltage when electrons are not trapped. By using this characteristic, the conventional SONOS memory can store and reproduce data.

However, this conventional SONOS memory requires a long time to erase data stored therein and has a short retention time, i.e., it cannot retain stored data for a long time.

In addition, when a tunneling oxide layer and a blocking oxide layer are composed of silicon oxide, the SONOS memory needs a high driving voltage, e.g., about 10 V, thereby hindering high integration of the memory.

SUMMARY OF THE INVENTION

The present invention is therefore directed to a silicon oxide nitride oxide semiconductor (SONOS) type memory device, which substantially overcomes one or more of the problems due to the limitations and disadvantages of the related art.

It is a feature of an embodiment of the present invention to provide a SONOS type memory device that does not require a high driving voltage.

It is another feature of an embodiment of the present invention to provide a SONOS type memory device that retains stored data normally for a relatively long time.

It is still another feature of an embodiment of the present invention to provide a SONOS type memory device having reduced programming time and erasing time.

At least one of the above and other features and advantages may be realized by providing a SONOS type memory device including a semiconductor substrate, a first impurity region and a second impurity region in the semiconductor substrate, the first impurity region and the second impurity region doped with impurity ions of a predetermined conductivity and separated a predetermined distance from each other, wherein a channel region exists between the first impurity region and the second impurity region, and a data storage type stack formed on the semiconductor substrate between the first impurity region and the second impurity region, wherein the data storage type stack includes a tunneling oxide layer, a memory node layer for storing data, a blocking oxide layer, and an electrode layer, which are sequentially formed, a dielectric constant of the memory node layer is higher than a dielectric constant of the tunneling oxide layer and a dielectric constant of the blocking oxide layer, and a band offset of the memory node layer is lower than a band offset of the tunneling oxide layer and a band offset of the blocking oxide layer, and the tunneling oxide layer and the blocking oxide layer are high dielectric insulating layers.

The tunneling oxide layer may be a material having a higher dielectric constant than silicon oxide ($SiO_2$), e.g., aluminum oxide ($Al_2O_3$). The tunneling oxide layer and the blocking oxide layer may be made of a same material. The blocking oxide layer may be aluminum oxide ($Al_2O_3$). The memory node layer may be hafnium oxide ($HfO_2$).

The memory node layer may be selected from the group consisting of a MO layer, a MON layer, and a MSiON layer, where M is a metal. The metal may be selected from the group consisting of hafnium (Hf), zirconium (Zr), tantalum (Ta), titanium (Ti), or one in the lanthanide (Ln) series including lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The SONOS type memory device of the present invention can greatly reduce programming time and erasing time, thereby improving data processing speed. Also, since a driving voltage of the memory device can be reduced to about 6 V, the memory device can be highly integrated.

BRIEF DESCRIPTION OF THE DRAWINGS

The above features and advantages of the present invention will become more apparent to those of ordinary skill in the art by describing in detail exemplary embodiments thereof with reference to the attached drawings in which.

DETAILED DESCRIPTION OF THE INVENTION

Figure 1:
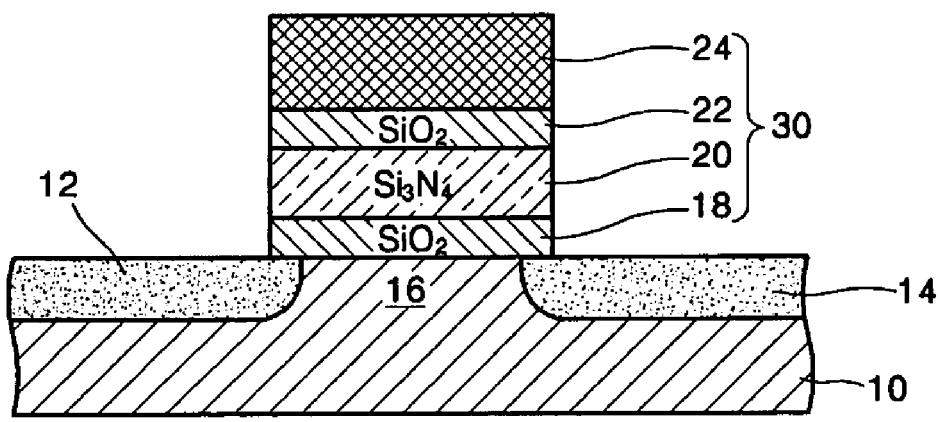
FIG. 1 illustrates a cross-sectional view of a conventional silicon oxide nitride oxide semiconductor (SONOS) memory.

Korean Patent Application No. 2004-17998, filed on Mar. 17, 2004, in the Korean Intellectual Property Office, and entitled "SONOS Type Memory Device," is incorporated by reference herein in its entirety.

A SONOS type memory device according to the present invention will now be described more fully with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
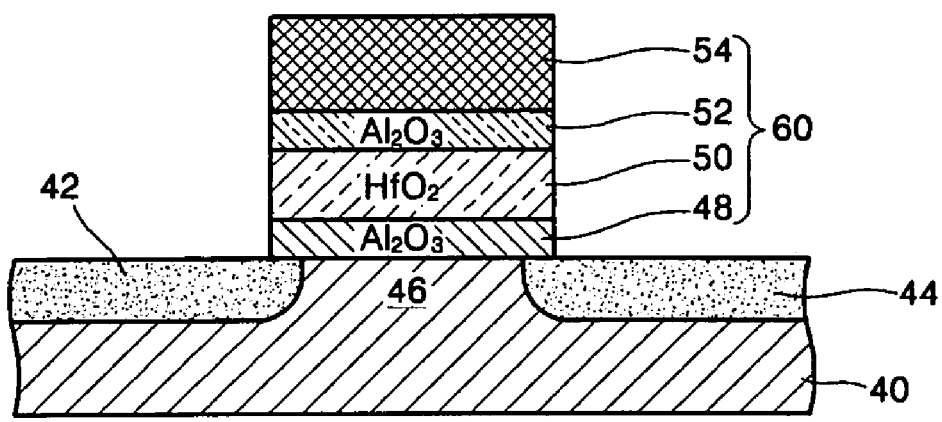
FIG. 2 illustrates a cross-sectional view of a SONOS type memory according to an embodiment of the present invention.

FIG. 2 illustrates a cross-sectional view of a silicon oxide nitride oxide semiconductor (SONOS) type memory according to an embodiment of the present invention.

Referring to FIG. 2, the SONOS type memory includes a substrate 40, e.g., a p-type semiconductor substrate, and a first impurity region 42 and a second impurity region 44, which are formed in the substrate 40. The first and second impurity regions 42 and 44 are doped with impurity ions of a predetermined conductivity, e.g., n-type impurity ions, to a predetermined depth. The first and second impurity regions 42 and 44 are separated a predetermined distance apart from each other, and a channel region 46 doped with impurity ions of a predetermined conductivity is formed between the first and second impurity regions 42 and 44.

Hereinafter, the first impurity region 42 and the second impurity region 44 are referred to as a source region and a drain region, respectively.

A data storage type gate stack 60, which will be referred to as a gate stack, is formed on the semiconductor substrate 40 between the source and drain regions 42 and 44, i.e., on the channel region 46. The gate stack 60 includes a tunneling oxide layer 48, a memory node layer 50, a blocking oxide layer 52, and an electrode layer 54, which are sequentially stacked.

The tunneling oxide layer 48 contacts the entire surface of the channel region 46, and outer edges of the tunneling oxide layer 48 contact the source region 42 and the drain region 44, respectively. The tunneling oxide layer 48 is formed of a material having a higher dielectric constant than silicon oxide ($SiO_2$), which is a conventional material for a tunneling oxide layer in a SONOS memory. For example, the tunneling oxide layer 48 may be formed of alumina ($Al_2O_3$). Also, since the tunneling oxide layer 48 determines characteristics of a transistor, the tunneling oxide layer 48 may be formed of a high dielectric material serving as a gate insulating layer. Accordingly, of the dielectric materials shown in FIG. 3 described below, the tunneling oxide layer 48 may be formed of alumina or magnesium oxide (MgO), both of which have a higher dielectric constant than $SiO_2$. The tunneling oxide layer 48 may be formed to a thickness of about 1.5 nm to about 5 nm.

When an appropriate voltage is applied to the electrode layer 54, electrons that have passed through the tunneling oxide layer 48 are trapped in the memory node layer 50. When electrons are trapped in the memory node layer 50, data "1" is stored. When electrons are not trapped in the memory node layer 50, data "0" is stored. Since the memory node layer 50 is included in the gate stack 60, this gate stack 60 can be properly referred to as a data storage type stack.

As described above, the memory node layer 50 is used as an electron trap layer. Thus, a trap site density of the memory node layer 50 is preferably as high as possible. Also, the memory node layer 50 is formed of a material having a higher dielectric constant and a lower band offset than the tunneling oxide layer 48 and the blocking oxide layer 52, described below. Here, "band offset" refers to a conduction band offset, i.e., a gap between a conduction band of a corresponding oxide and a conduction band of a semiconductor substrate, e.g., a Si substrate. Thus, the memory node layer 50 is formed of a material having a higher trap density than the tunneling oxide layer 48 and the blocking oxide layer 52. In view of the foregoing, the memory node layer 50 may be a metal oxide (MO) layer, an N-based metal oxynitride (MON) layer, or a metal silicon oxynitride (MSiON) layer. In the MO layer, the MON layer, and the MSiON layer, the M represents a metal, such as hafnium (Hf), zirconium (Zr), tantalum (Ta), titanium (Ti), and one in the lanthanide (Ln) series. The Ln series includes lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu). Preferably, the memory node layer 50 is an $HfO_2$ layer. The memory node layer 50 may be formed to a thickness of about 5 nm to about 25 nm.

The blocking oxide layer 52 is interposed between the memory node layer 50 and the electrode layer 54 in order to prevent the electrons trapped in the memory node layer 50 from moving to the electrode layer 54. Like the tunneling oxide layer 48, the blocking oxide layer 52 may be formed of a material having a high dielectric constant and a higher band offset than the memory node layer 50. The blocking oxide layer 52 may be formed of the same material as the tunneling oxide layer 48. For example, the blocking oxide layer 52 may be formed of alumina ($Al_2O_3$). The blocking oxide layer 52 may be formed to a thickness of about 5 nm to about 25 nm.

The electrode layer 54, which is used as a gate electrode, may be a polysilicon layer doped with conductive impurity ions or may be another conductive layer, e.g., a tungsten silicide layer.

The channel region 46 disposed between the source and drain regions 42 and 44 is turned on or turned off according to a voltage applied to the electrode layer 54 of the gate stack 60. In other words, a state of the channel region 46 can be switched by applying an appropriate voltage to the electrode layer 54. Thus, the source and drain regions 42 and 44 and the gate stack 60 constitute a switching device, e.g., a transistor. Also, since the gate stack 60 includes the memory node layer 50 as described above, the switching device performs a data storage function. Hence, the source and drain regions 42 and 44 and the gate stack 60 constitute a multifunctional device that performs both a switching function and a storage function. The multifunctional device is structurally equivalent to a transistor, but can be referred to as a data storage type or memory type transistor because of the additional data storage function.

The operation of the SONOS type memory shown in FIG. 2 is as follows. A first predetermined gate voltage Vg is applied via the electrode layer 54 to the gate stack 60, and a first predetermined drain voltage Vd is applied to the drain region 44, thereby storing data in the memory node layer 50. The stored data is read by applying a second predetermined gate voltage Vg' (Vg'<Vg) to the gate stack 60, applying a second predetermined drain voltage Vd' (Vd'<Vd) to the drain region 44, and determining a magnitude of a current flowing between the source and drain regions 42 and 44.

Figure 3:
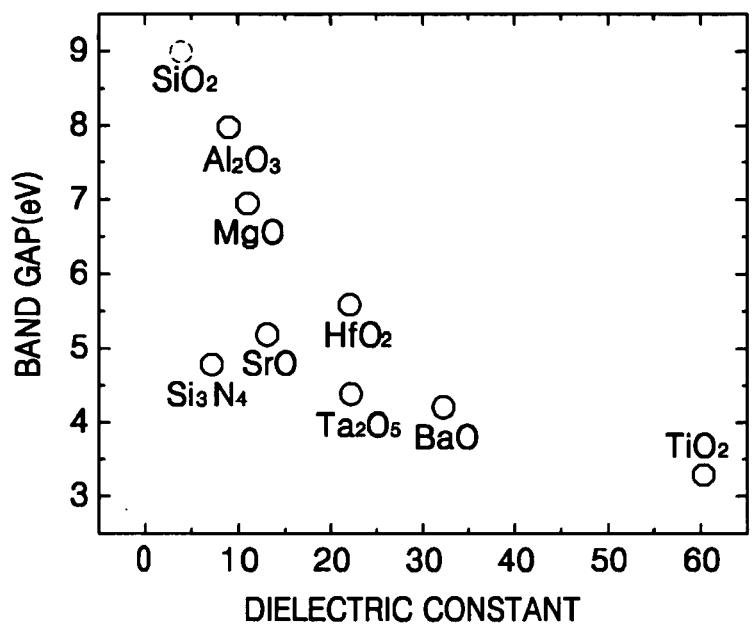
FIG. 3 illustrates band gaps with respect to dielectric constants for certain materials.

FIG. 3 illustrates band gaps with respect to dielectric constants for certain materials, i.e., silicon nitride and oxides of silicon, aluminum, magnesium, strontium, hafnium, tantalum, barium and titanium.

Referring to FIG. 3, materials having higher dielectric constants generally have lower band gaps. The tunneling oxide layer (48 of FIG. 2) and the blocking oxide layer (52 of FIG. 2) may be formed of a material having a higher dielectric constant than $SiO_2$, e.g., alumina. The memory node layer (50 of FIG. 2) can be formed of an oxide, e.g., hafnium oxide ($HfO_2$), having a higher dielectric constant than that of alumina forming the tunneling oxide layer 48 and the blocking oxide layer 52.

Figure 4:
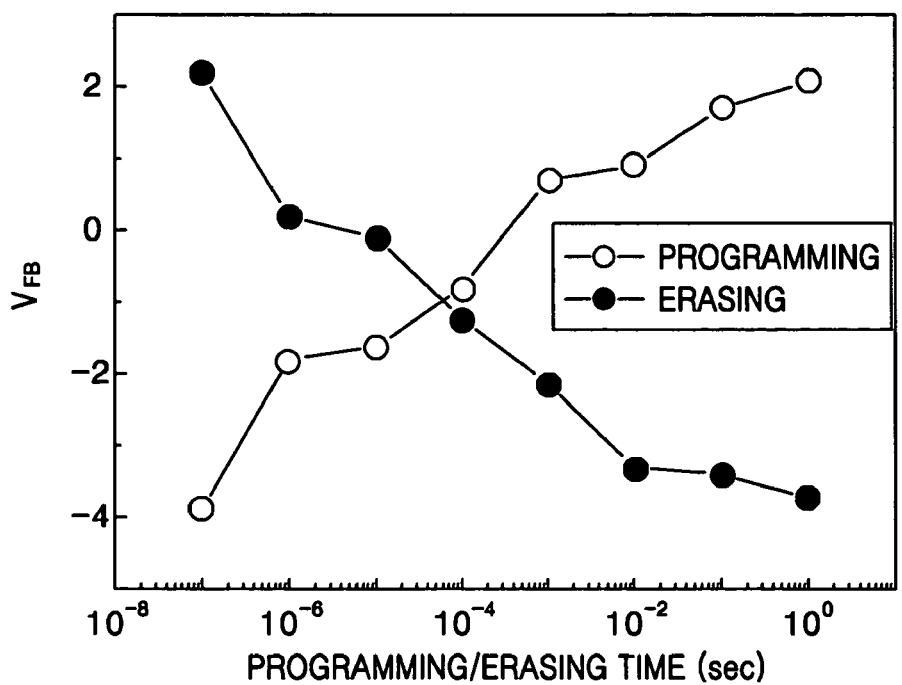
FIG. 4 is a graph illustrating a variation of flat band voltage $V_{FB}$ according to programming time and erasing time of the memory shown in FIG. 2.

FIG. 4 is a graph illustrating a variation of flat band voltage $V_{FB}$ according to programming time and erasing time of the memory shown in FIG. 2.

In the SONOS type memory of the present invention, the tunneling oxide layer 48, the memory node layer 50, and the blocking oxide layer 52 are formed of $Al_2O_3$, $HfO_2$, and $Al_2O_3$, respectively. To measure the flat band voltage $V_{FB}$ according to the programming time and erasing time, a programming voltage of 6 V and an erasing voltage of –6 V were applied to the memory.

Referring to FIG. 4, when the programming time and the erasing time are both about 1 ms, a memory window of about 2 V, which is sufficient for programming and erasing, is obtained. That is, data can be sufficiently programmed and erased in a short amount of time.

Figure 5:
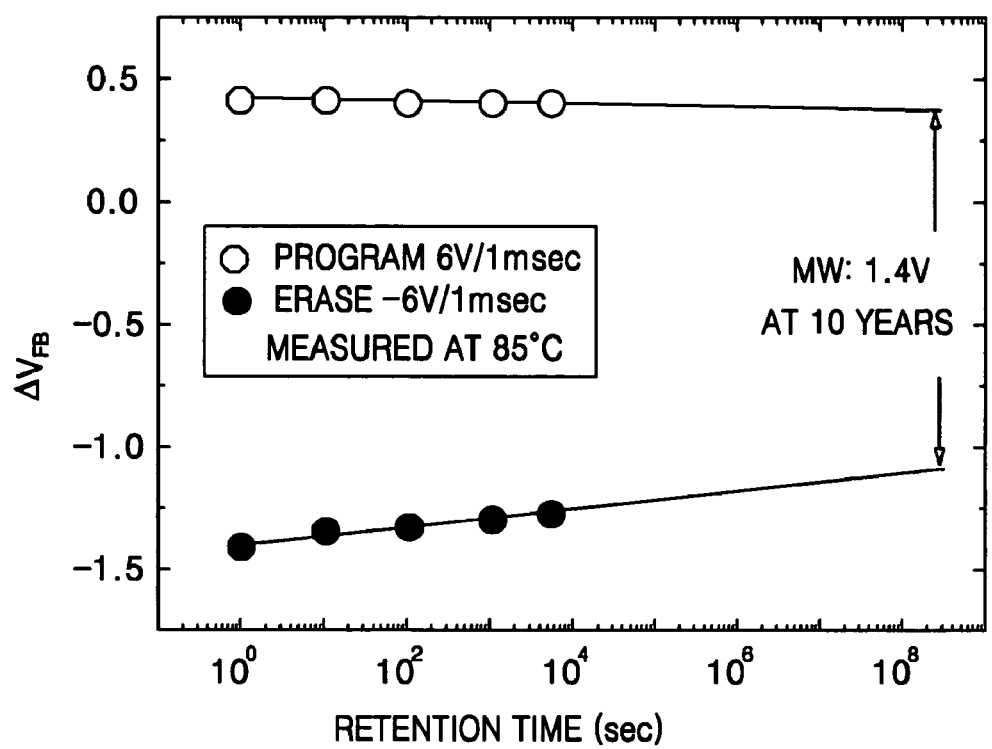
FIG. 5 is a graph illustrating retention time of data in the memory shown in FIG. 2.

FIG. 5 is a graph illustrating retention time of data in the memory shown in FIG. 2.

Referring to FIG. 5, by extrapolating from the results for shorter time periods, when a programming voltage of 6 V and an erasing voltage of –6 V are applied to the memory of the present invention, and the programming and erasing times are maintained at about 1 ms under the same conditions used to obtain the results shown in FIG. 4, even after an elapse of ten years, a difference in the flat band voltage $V_{FB}$ is 1.4 V. Thus, the SONOS type memory of the present invention has a good memory storage characteristic.

Figure 6:
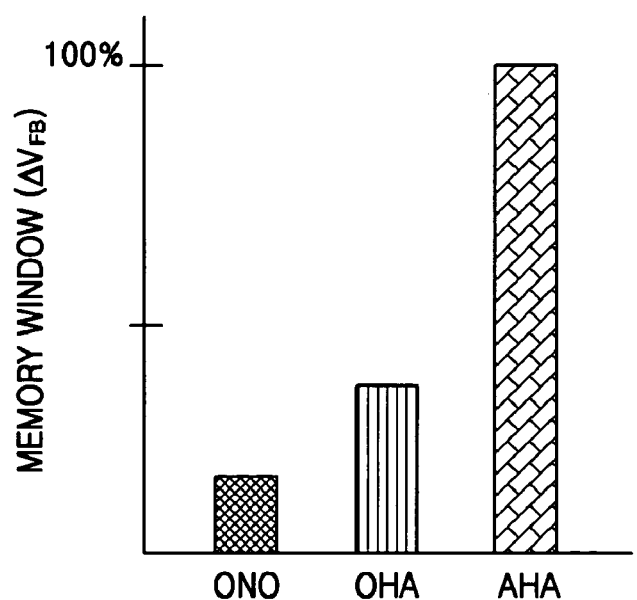
FIG. 6 is a graph illustrating relative rates of memory windows for the memory shown in FIG. 2 and conventional memories.

FIG. 6 is a graph illustrating relative memory windows for the memory device shown in FIG. 2 and conventional memory devices. Referring to FIG. 6, ONO refers to a conventional SONOS memory including $SiO_2$—$Si_3N_4$—$SiO_2$, OHA refers to a conventional SONOS type memory including $SiO_2$—$HfO_2$—$Al_2O_3$, and AHA refers to a SONOS type memory including $Al_2O_3$—$HfO_2$—$Al_2O_3$ in accordance with the present invention.

Referring to FIG. 6, assuming a memory window of the AHA memory device of the present invention is 100%, memory windows of the other memory devices are less than 50%. That is, the memory device of the present invention has better memory characteristics than the conventional memory devices.

Although only an AHA type memory has been described in the embodiment of the present invention, the present invention is not limited thereto. The SONOS type memory of the present invention may include three high dielectric insulating layers, of which a band diagram has a well structure, such as $HfO_2$—$TiO_2$—$HfO_2$ or $ZrO_2$—$SrTiO_2$—$ZrO_2$. Additionally, the tunneling oxide layer and the blocking oxide layer may be different materials.

As explained thus far, a SONOS type memory of the present invention includes a tunneling oxide layer and a blocking oxide layer, which are formed of first material having a higher dielectric constant than $SiO_2$, e.g., $Al_2O_3$, and a memory node layer, which is formed of a second material having a higher dielectric constant than the first material, e.g., $HfO_2$. Thus, as can be seen from FIG. 4, both programming time and erasing time can be shortened even at a low driving voltage, e.g., 6 V, thereby increasing data processing speed. Also, as can be seen from FIG. 5, the memory of the present invention has a long retention period. Therefore, the present invention can increase the integration density of memory devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A silicon oxide nitride oxide semiconductor (SONOS) type memory device comprising:
   a semiconductor substrate;
   a first impurity region and a second impurity region in the semiconductor substrate, the first impurity region and the second impurity region doped with impurity ions of a predetermined conductivity and separated a predetermined distance from each other, wherein a channel region exists between the first impurity region and the second impurity region; and
   a data storage type stack formed on the semiconductor substrate between the first impurity region and the second impurity region,
   wherein the data storage type stack includes a tunneling oxide layer, a memory node layer for storing data, a blocking oxide layer, and an electrode layer, which are sequentially formed,
   a dielectric constant of the memory node layer is higher than a dielectric constant of the tunneling oxide layer and a dielectric constant of the blocking oxide layer, and a band offset of the memory node layer is lower than a band offset of the tunneling oxide layer and a band offset of the blocking oxide layer,
   the tunneling oxide layer and the blocking oxide layer are high dielectric insulating layers,
   the memory node layer is a MON layer or a MSiON layer, where M is a metal, and
   the tunneling oxide layer is a material having a higher dielectric constant than silicon oxide ($SiO_2$).

2. The device as claimed in claim 1, wherein the tunneling oxide layer is aluminum oxide ($Al_2O_3$).

3. The device of claim 2, wherein the blocking oxide layer is aluminum oxide ($Al_2O_3$).

4. The device as claimed in claim 1, wherein the tunneling oxide layer and the blocking oxide layer are made of a same material.

5. The device as claimed in claim 1, wherein the metal is selected from the group consisting of hafnium (Hf), zirconium (Zr), tantalum (Ta), titanium (Ti), or one in the lanthanide (Ln) series including lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

* * * * *